(12) United States Patent
Sumiyoshi

(10) Patent No.: US 12,063,021 B2
(45) Date of Patent: Aug. 13, 2024

(54) HIGH FREQUENCY CIRCUIT

(71) Applicant: Sumitomo Electric Industries, Ltd., Osaka (JP)

(72) Inventor: Takashi Sumiyoshi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 34 days.

(21) Appl. No.: 17/891,656

(22) Filed: Aug. 19, 2022

(65) Prior Publication Data
US 2023/0108671 A1 Apr. 6, 2023

(30) Foreign Application Priority Data
Oct. 1, 2021 (JP) .................... 2021-162511

(51) Int. Cl.
| | | |
|---|---|---|
| H03F 3/00 | (2006.01) | |
| H03F 1/56 | (2006.01) | |
| H03H 7/00 | (2006.01) | |
| H03H 11/28 | (2006.01) | |

(52) U.S. Cl.
CPC ............. *H03H 11/28* (2013.01); *H03F 1/565* (2013.01); *H03H 7/00* (2013.01)

(58) Field of Classification Search
CPC .......... H03F 1/565; H03F 3/195; H03F 3/601; H03F 2200/387; H03F 2200/222; H03F 2200/246; H03F 3/191; H03F 2200/318; H03F 31/083; H03H 7/00; H03H 11/28
See application file for complete search history.

(56) References Cited

U.S. PATENT DOCUMENTS

| | | | | |
|---|---|---|---|---|
| 5,748,042 A | * | 5/1998 | Norris | H03F 1/3205 330/306 |
| 5,905,409 A | * | 5/1999 | Fujimoto | H03F 3/1935 330/306 |
| 6,163,221 A | * | 12/2000 | Matsuno | H03F 1/08 330/306 |
| 6,236,274 B1 | * | 5/2001 | Liu | H03F 3/72 330/306 |
| 6,249,186 B1 | * | 6/2001 | Ebihara | H01L 23/66 330/277 |
| 7,554,410 B2 | * | 6/2009 | Kawashima | H03F 3/189 330/306 |
| 7,944,304 B1 | * | 5/2011 | Patten | H03F 3/245 330/277 |

(Continued)

FOREIGN PATENT DOCUMENTS

| | | |
|---|---|---|
| JP | 09-284051 A | 10/1997 |
| JP | 2000-183773 A | 6/2000 |

*Primary Examiner* — Tuan T Lam
(74) *Attorney, Agent, or Firm* — Volpe Koenig

(57) ABSTRACT

A high frequency circuit includes a transistor having an input electrode that inputs a high frequency signal and an output electrode that outputs the high frequency signal, a transmission line that is connected to any one of the input electrode and the output electrode, and transmits the high frequency signal, a coupling line electrically separated from the transmission line to an extent that an electromagnetic field coupling is enabled with the transmission line, and a resonance circuit that is connected between a first end of the coupling line and a reference potential, and minimizes an impedance between the first end and the reference potential at a resonance frequency.

8 Claims, 9 Drawing Sheets

(56) References Cited

U.S. PATENT DOCUMENTS

| | | | |
|---|---|---|---|
| 2006/0145761 A1* | 7/2006 | Pribble | H03F 3/217 330/251 |
| 2009/0009255 A1* | 1/2009 | Tsai | H03F 1/301 330/291 |
| 2010/0079211 A1* | 4/2010 | Matsuda | H03F 3/245 330/306 |
| 2010/0148858 A1* | 6/2010 | Suzuki | H03F 3/601 327/543 |
| 2011/0273234 A1* | 11/2011 | van der Heijden | H03F 1/0294 330/295 |
| 2012/0092598 A1* | 4/2012 | Kyrlidis | C09B 68/463 546/37 |

* cited by examiner

HIGH FREQUENCY CIRCUIT

CROSS REFERENCE TO RELATED APPLICATIONS

This application claims priority based on Japanese Patent Application No. 2021-162511 filed on Oct. 1, 2021, and the entire contents of the Japanese patent applications are incorporated herein by reference.

FIELD

The present disclosure relates to a high frequency circuit.

BACKGROUND

It is known that a first end of an open stub is connected to a main line through which a high frequency signal is transmitted in a high frequency circuit, the transmission line is brought close to the open stub, and both ends of the transmission line are grounded via a resistor (for example, Patent Document 1: Japanese Laid-open Patent Publication No. 09-284051). It is known to provide a parallel resonance circuit in a bias circuit that supplies a bias voltage to a transistor (for example, Patent Document 2: Japanese Laid-open Patent Publication No. 2000-183773).

SUMMARY

A high frequency circuit according to the present disclosure includes: a transistor having an input electrode that inputs a high frequency signal and an output electrode that outputs the high frequency signal; a transmission line that is connected to any one of the input electrode and the output electrode, and transmits the high frequency signal; a coupling line electrically separated from the transmission line to an extent that an electromagnetic field coupling is enabled with the transmission line; and a resonance circuit that is connected between a first end of the coupling line and a reference potential, and minimizes an impedance between the first end and the reference potential at a resonance frequency.

DETAILED DESCRIPTION OF EMBODIMENTS

Figure 1:
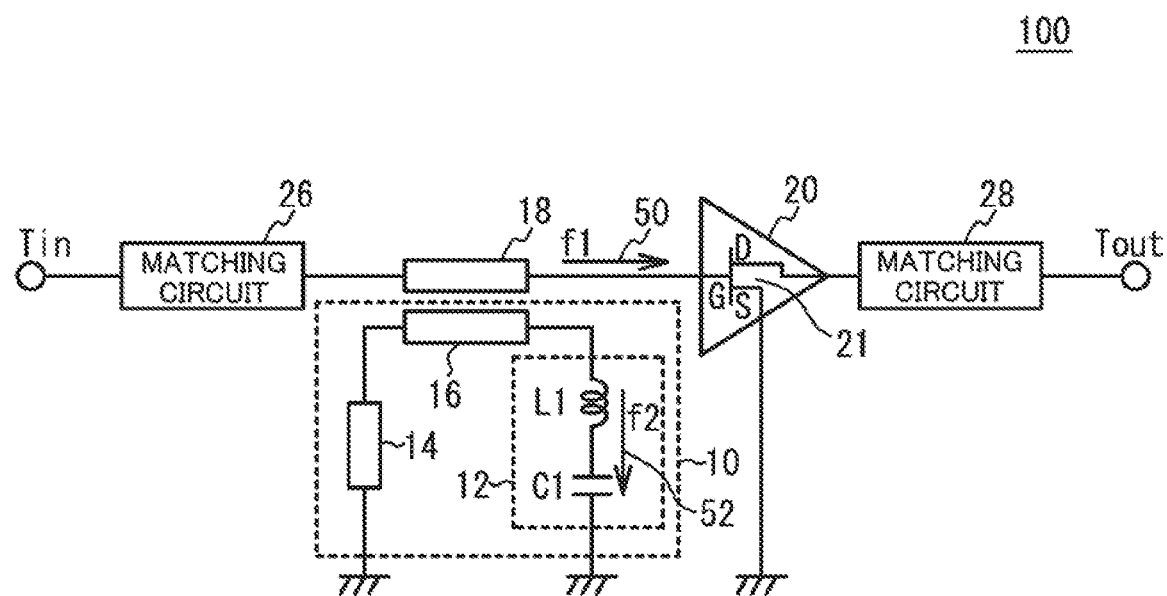
FIG. 1 is a circuit diagram illustrating a high frequency circuit according to a first embodiment.

In Patent Documents 1 and 2, the operation of the high frequency circuit can be stabilized. However, if a stabilizing circuit that stabilizes the operation of the high frequency circuit is directly connected to a line on which the high frequency signal is transmitted, the characteristics of the high frequency circuit are affected and the characteristics are deteriorated.

The present disclosure has been made in view of the above problems, and an object of the present disclosure is to stabilize the operation and suppress the deterioration of the characteristics.

Description of Embodiments of the Present Disclosure

First, the contents of the embodiments of this disclosure are listed and explained.

(1) A high frequency circuit according to the present disclosure includes: a transistor having an input electrode that inputs a high frequency signal and an output electrode that outputs the high frequency signal; a transmission line that is connected to any one of the input electrode and the output electrode, and transmits the high frequency signal; a coupling line electrically separated from the transmission line to an extent that an electromagnetic field coupling is enabled with the transmission line; and a resonance circuit that is connected between a first end of the coupling line and a reference potential, and minimizes an impedance between the first end and the reference potential at a resonance frequency. By connecting the resonance circuit to the coupling line, it is possible to stabilize the operation and suppress the deterioration of the characteristics.

(2) The high frequency circuit further may include a resistance element. A first end of the resistance element may be connected to a second end of the coupling line, a second end of the resistance element may be connected to the reference potential, and a resistance value of the resistance element may be ½ times or more and twice or less a characteristic impedance of the coupling line at a center frequency of an operating frequency band of the high frequency circuit.

(3) The high frequency circuit further may include an input terminal that inputs the high frequency signal, and a matching circuit that matches an input impedance of the input terminal with an input impedance of the input electrode. A first end of the transmission line may be connected to the matching circuit, and a second end of the transmission line may be connected to the input electrode.

(4) The high frequency circuit further may include an output terminal that inputs the high frequency signal, and a matching circuit that matches an output impedance of the output electrode with an output impedance of the output terminal. A first end of the transmission line may be connected to the output electrode, and a second end of the transmission line may be connected to the matching circuit.

(5) The input electrode may be a gate and the output electrode may be a drain.

(6) At the resonance frequency of the resonance circuit, a stability coefficient of the high frequency circuit when the coupling line and the resonance circuit are not provided may be less than 1.

(7) The resonance frequency of the resonance circuit may be lower than an operating frequency band of the high frequency circuit.

(8) The resonance circuit may include an inductor and a capacitor connected in series between the first end of the coupling line and the reference potential.

Details of Embodiments of the Present Disclosure

Specific examples of a high frequency circuit in accordance with embodiments of the present disclosure are described below with reference to the drawings. The present disclosure is not limited to these examples, but is indicated by the claims, which are intended to include all modifications within the meaning and scope of the claims.

First Embodiment

In a first embodiment, a high frequency power amplifier used as a base station for mobile communication as a high frequency circuit will be described as an example. FIG. 1 is a circuit diagram illustrating the high frequency circuit according to the first embodiment. As illustrated in FIG. 1, a high frequency circuit 100 includes a stabilizing circuit 10, an amplifier 20, and matching circuits 26 and 28. The amplifier 20 includes a transistor 21. The transistor 21 is a FET (Field Effect Transistor) such as, for example, a GaN HEMT (Gallium Nitride High Electron Mobility Transistor). A center frequency in a band of the high frequency circuit 100 is, for example, 0.5 GHz to 10 GHz.

An input terminal Tin is connected to a gate G of the transistor 21 via the matching circuit 26, and a drain D of the transistor 21 is connected to an output terminal Tout via the matching circuit 28. A source S of the transistor 21 is connected to a ground potential (reference potential). The transistor 21 amplifies a high frequency signal 50 input to the input terminal Tin and outputs the amplified high frequency signal 50 to the output terminal Tout. A frequency f1 of the high frequency signal 50 amplified by the amplifier 20 is, for example, a center frequency in an operating band of the high frequency circuit 100. The matching circuit 26 matches an input impedance when the input terminal Tin is viewed from an external circuit at the frequency f1 with an input impedance of the amplifier 20 when the gate G is viewed from the matching circuit 26. The matching circuit 28 matches an output impedance of the amplifier 20 when the matching circuit 28 is viewed from the drain D at the frequency f1 with an output impedance when the external circuit is viewed from the output terminal Tout. A transmission line 18 is provided between the matching circuit 26 and the gate G.

The stabilizing circuit 10 includes a resonance circuit 12, a resistance element 14, and a coupling line 16. The coupling line 16 extends in an extension direction of the transmission line 18, and the transmission line 18 is provided away from the coupling line 16 by a certain distance. The coupling line 16 is electromagnetically coupled to the transmission line 18. A second end of the coupling line 16 is connected to the reference potential via the resistance element 14. A resistance value of the resistance element 14 is a characteristic impedance of the coupling line 16 at the frequency f1. A first end of the coupling line 16 is connected to the reference potential via the resonance circuit 12. The resonance circuit 12 is a series resonance circuit including an inductor L1 and a capacitor C1. An impedance between the coupling line 16 and the reference potential is minimized at a resonance frequency fr of the resonance circuit 12. The resonance frequency fr is, for example, a frequency at which the high frequency circuit 100 is likely to oscillate (i.e., the high frequency circuit 100 is likely to become unstable) when the stabilizing circuit 10 is not provided.

A stability coefficient K of the high frequency circuit 100 is given by the following formula 1.

$$K = \frac{1 - |S_{11}|^2 - |S_{22}|^2 + |D|^2}{2|S_{12}S_{21}|}$$ (Formula 1)

Here, "D=S11×S22−S12×S21" is satisfied, and S11, S22, S21 and S12 are S-parameters when the input terminal Tin and the output terminal Tout are set to a port 1 and a port 2, respectively.

When the stability coefficient K is 1 or less, the high frequency circuit 100 becomes unstable and easily oscillates. The high frequency circuit is designed using the matching circuits 26 and 28 so that the stability coefficient K is larger than 1 in a band in which the high frequency circuit 100 operates. However, when the high frequency circuit 100 operates, the high frequency circuit 100 also performs a non-linear operation. Therefore, a signal having a frequency other than an operating frequency band in which the high frequency circuit 100 operates is generated inside the high frequency circuit 100. When the stability coefficient K is 1 or less at a frequency other than the band in which the high frequency circuit 100 operates, the high frequency circuit 100 is likely to oscillate. Since a high frequency signal 52 having a frequency f2 near the resonance frequency fr flows from the transmission line 18 to the ground via the coupling line 16, the parameter S21 of the high frequency circuit 100 at the frequency f2 decreases. According to formula 1, when the parameter S21 of the high frequency circuit 100 decreases, the stability coefficient K increases. Therefore, the stability coefficient K near the frequency f2 can be increased. Since the impedance of the resonance circuit 12 is large at the frequency f1, the high frequency signal 50 does not pass through the resonance circuit 12. The second end of the coupling line 16 is terminated by the resistance element 14. Therefore, the isolation between the transmission line 18 and the coupling line 16 becomes large at the frequency f1. Therefore, the stabilizing circuit 10 has almost no effect on the transmission line 18 at the frequency f1, and a gain of the high frequency circuit 100 at the frequency f1 hardly changes depending on the presence or absence of the stabilizing circuit 10. The resistance value of the resistance element 14 is the characteristic impedance of the coupling line 16, and is, for example, 50Ω.

Figure 2:
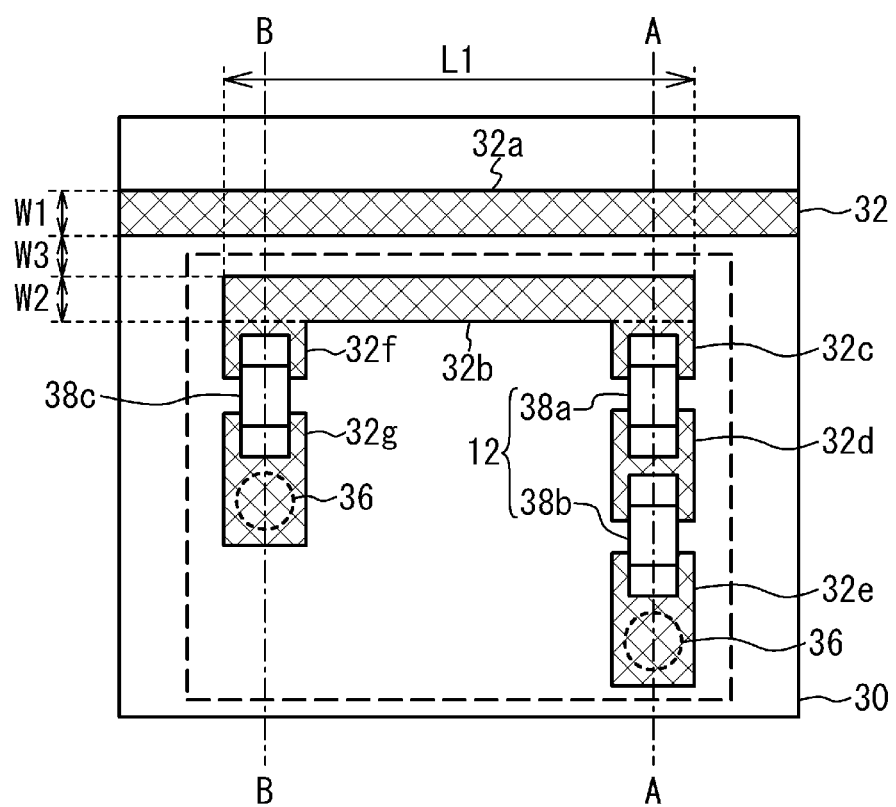
FIG. 2 is a plan view illustrating a stabilizing circuit according to the first embodiment.
Figure 3:
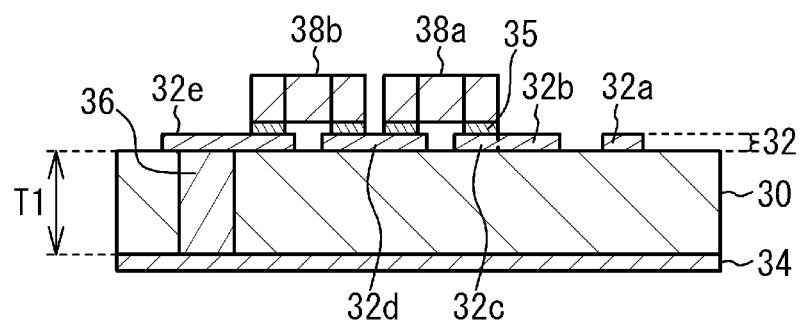
FIG. 3 is a cross-sectional view taken along line A-A of FIG. 2.
Figure 4:
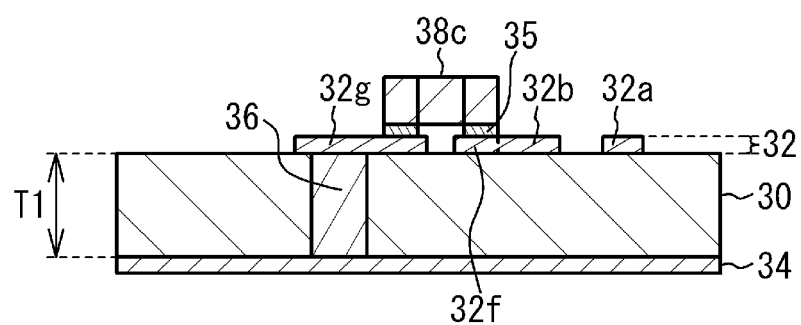
FIG. 4 is a cross-sectional view taken along line B-B of FIG. 2.

FIG. 2 is a plan view illustrating the stabilizing circuit 10 according to the first embodiment. FIGS. 3 and 4 are cross-sectional views taken along lines A-A and B-B of FIG. 2, respectively. As illustrated in FIGS. 2 to 4, a metal layer 32 is provided on an upper surface of a dielectric substrate 30, and a metal layer 34 is provided on a lower surface of the dielectric substrate 30. The dielectric substrate 30 is a dielectric substrate made of a resin or ceramic such as FR-4 (Flame Retardant Type 4). The metal layers 32 and 34 are, for example, a copper layer or a gold layer. The metal layer 34 is provided on the entire lower surface of the dielectric substrate 30, and the reference potential such as the ground potential is supplied to the metal layer 34. The metal layer 32 forms patterns 32a to 32g.

The pattern 32a is a signal line of the transmission line 18. The pattern 32a and the metal layer 32 form a microstrip line. A pattern 32b is a signal line of the coupling line 16. The pattern 32a are substantially parallel to the pattern 32b. The pattern 32b and the metal layer 32 form a microstrip line. The widths of the patterns 32a and 32b are W1 and W2. An interval between the patterns 32a and 32b is W3. The length of the pattern 32b is L1. The thickness of the dielectric substrate 30 is T1. The widths W1, W2 and the thickness T1 are designed so that the characteristic impedances of the transmission line 18 and the coupling line 16 become desired values at the frequency f1. The interval W3 and the length L1 are set so that an amount of coupling between the transmission line 18 and the coupling line 16 is a desired value that does not affect a passing loss of the transmission line 18.

A pattern 32c is connected to the first end of the pattern 32b. A pattern 32d is provided away from the pattern 32c, and a pattern 32e is provided away from the pattern 32d. Both ends of an electronic component 38a are bonded on the patterns 32c and 32d using a bonding material 35, respectively. Both ends of an electronic component 38b are bonded on the patterns 32d and 32e using the bonding material 35, respectively. The pattern 32e is electrically connected to the metal layer 34 by a through electrode 36 penetrating the dielectric substrate 30 and is short-circuited. The electronic component 38a is a coil component and corresponds to the inductor L1. The electronic component 38b is a capacitor component and corresponds to the capacitor C1. The resonance circuit 12 is formed by the electronic components 38a and 38b.

A pattern 32f is connected to a second end of the pattern 32b. A pattern 32g is provided away from the pattern 32f. Both ends of an electronic component 38c are bonded on the patterns 32f and 32g using the bonding material 35, respectively. The pattern 32g is electrically connected to the metal layer 34 by the through electrode 36 penetrating the dielectric substrate 30 and is short-circuited. The electronic component 38c is a resistor component and corresponds to a resistor R1.

Although the electronic components 38a to 38c are used as the inductor L1, the capacitor C1 and the resistor R1 as an example, the inductor L1 may be a line pattern formed by the metal layer 32. The capacitor C1 may be a MIM (Metal Insulator Metal) capacitor provided on the dielectric substrate 30. The resistor R1 may be a resistance thin film provided on the dielectric substrate 30.

Comparative Example

Figure 5:
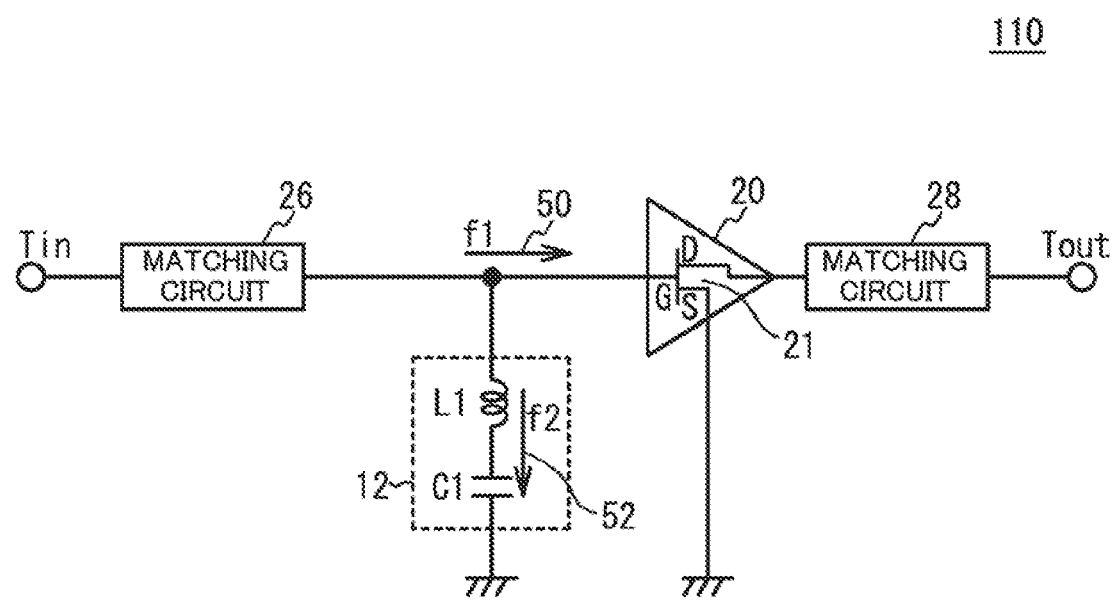
FIG. 5 is a circuit diagram illustrating a high frequency circuit according to a comparative example.

FIG. 5 is a circuit diagram illustrating a high frequency circuit according to a first comparative example. As illustrated in FIG. 5, in a high frequency circuit 110 in the first comparative example, the resonance circuit 12 is shunt-connected to the transmission line between the matching circuit 26 and the gate G. In the first comparative example, the stability coefficient K of the high frequency circuit 110 at the frequency f2 can be increased by setting the resonance frequency fr of the resonance circuit 12 to be in the vicinity of the frequency f2 of the high frequency signal 52, as in the first embodiment. On the other hand, a band of the high frequency circuit 110 is different from the resonance frequency of the resonance circuit 12. Therefore, the impedance of the resonance circuit 12 becomes high in the vicinity of the frequency f1 of the high frequency signal 50. Therefore, the decrease in the gain of the high frequency circuit 110 at the frequency f1 is suppressed.

However, at the frequency f1, the impedance of the resonance circuit 12 is high but not infinite. Therefore, a part of the high frequency signal 50 leaks to the reference potential via the resonance circuit 12. This increases the loss at the frequency f1. Further, the inductor L1 and the capacitor C1 in the resonance circuit 12 affect the transmission line 18. For example, the resonance circuit 12 affects the impedance matching between the input terminal Tin and the gate G. Thereby, the impedance matching by the matching circuit 26 changes from an optimum state, and the high frequency characteristic of the high frequency circuit 110 deteriorates.

As a second comparative example with reference to Patent Document 1, it is also conceivable to connect an open stub having a length of λ/4 to the transmission line 18 and to connect the coupling line to the open stub. Note that "λ" is a wavelength at a frequency at which the stability coefficient K is to be increased. However, an area of the circuit becomes large due to the use of the λ/4 open stub. Since the open stub is connected to the transmission line 18, the open stub affects the impedance matching.

According to the first embodiment, the transmission line 18 for transmitting the high frequency signal 50 is connected to the gate G (input electrode for inputting the high frequency signal) of the transistor 21, as illustrated in FIG. 1. The coupling line 16 is electrically separated from the transmission line 18 to an extent that an electromagnetic field coupling is enabled with the transmission line 18 for transmitting the high frequency signal 50. This causes a part of the high frequency signal transmitted on the transmission line 18 to branch to the coupling line 16. The resonance circuit 12 is connected between the first end of the coupling line 16 and the ground (reference potential), and minimizes the impedance between the first end and the ground at the resonance frequency fr. Thereby, the high frequency signal 52 having the frequency f2 among the high frequency signals branched to the coupling line 16 flows to the ground via the resonance circuit 12. Therefore, it is possible to stabilize the operation of the high frequency circuit 110 at the frequency f2.

A first end of the resistance element 14 is connected to a second end of the coupling line 16 and the second end is connected to the ground. A resistance value of the resistance element 14 is a characteristic impedance of the coupling line 16 at the center frequency f1 in the operating frequency band of the high frequency circuit 100. Thereby, the isolation between the transmission line 18 and the coupling line 16 at the frequency f1 can be increased. Therefore, the high frequency signal 50 at the frequency f1 can be suppressed from leaking into the stabilizing circuit 10, and the decrease in the gain at the frequency f1 can be suppressed. Since the second end of the coupling line 16 is terminated by using the resistance element 14, the resistance value of the resistance element 14 is preferably ½ or more and twice or less, more preferably ⅔ or more and 1.5 times or less, and still more preferably ¾ or more and 1.3 times or less of the characteristic impedance of the coupling line 16 at the frequency f1.

A first end of the transmission line 18 is connected to the matching circuit 26 that matches the input impedance of the input terminal Tin with the input impedance of the gate G, and a second end of the transmission line 18 is connected to the gate G of the transistor. When the stabilizing circuit 10 is provided between the matching circuit 26 and the transistor 21, if the resonance circuit 12 is directly connected to the transmission line 18 as in the first comparative example, the resonance circuit 12 causes the impedance matching to deviate from the optimum value. Therefore, it is preferable to provide the coupling line 16 as in the first embodiment.

The resonance circuit 12 includes the inductor L1 and the capacitor C1 connected in series between the first end of the coupling line 16 and the ground. Thereby, the resonance circuit 12 is short-circuited at the resonance frequency fr, and the high frequency signal 52 having a frequency f2 in the vicinity of the resonance frequency fr can be passed to the ground to increase the stability coefficient K at the frequency f2. A connection order of the inductor L1 and the capacitor C1 may be reversed from that of the first embodiment.

First Variation of First Embodiment

Figure 6:
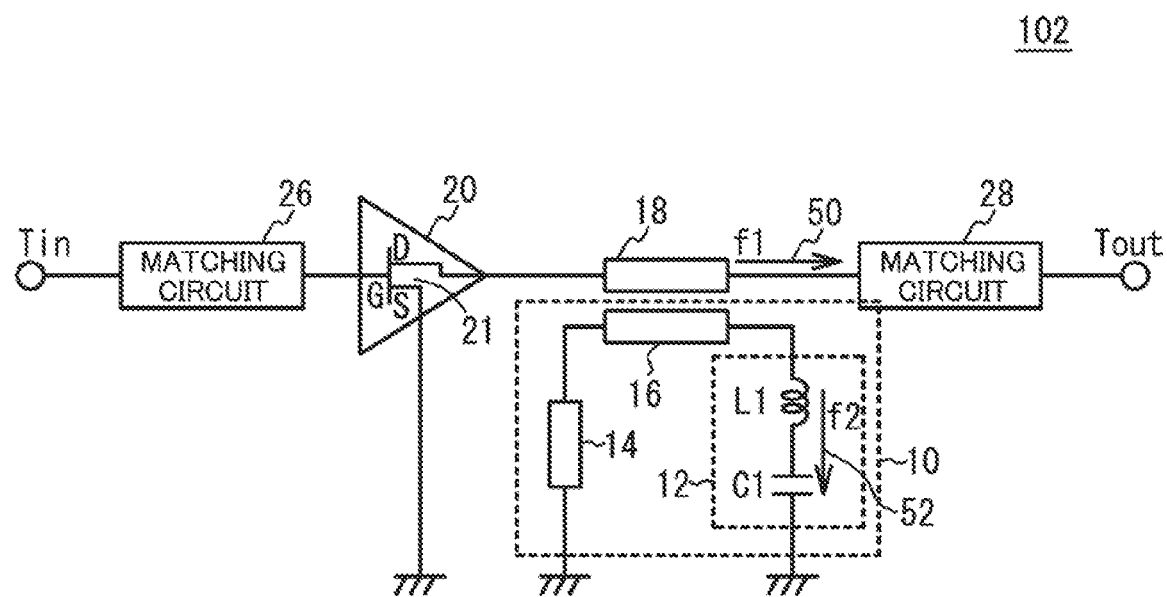
FIG. 6 is a circuit diagram illustrating a high frequency circuit according to a first variation of the first embodiment.

FIG. 6 is a circuit diagram illustrating a high frequency circuit according to a first variation of the first embodiment.

As illustrated in FIG. 6, in a high frequency circuit 102 of the first variation of the first embodiment, the first end of the transmission line 18 is connected to the drain D of the transistor 21, and the second end of the transmission line 18 is connected to the matching circuit 28. Other configurations are the same as those in the first embodiment, and the description thereof will be omitted. As in the first variation of the first embodiment, the transmission line 18 is connected to the drain D (output electrode for outputting the high frequency signal) of the transistor 21. The first end of the transmission line 18 may be connected to the drain D (output electrode) of the transistor 21, and the second end of the transmission line 18 may be connected to the matching circuit 28 that matches the output impedance of the drain D with the output impedance of the output terminal Tout.

When the transistor 21 is the amplifier 20, a high frequency signal having a large power is output to the drain D. Therefore, in the first variation of the first embodiment, each electronic component (electronic components 38a to 38c in FIGS. 2 to 4) in the stabilizing circuit 10 is an expensive component having a high withstand voltage. Therefore, the stabilizing circuit 10 is preferably provided between the matching circuit 26 and the gate G as in the first embodiment. When the transistor 21 functions as a multiplier or a mixer, the stabilizing circuit 10 may be provided between the drain D and the matching circuit 28, as in the first variation of the first embodiment.

Second Embodiment

Figure 7:
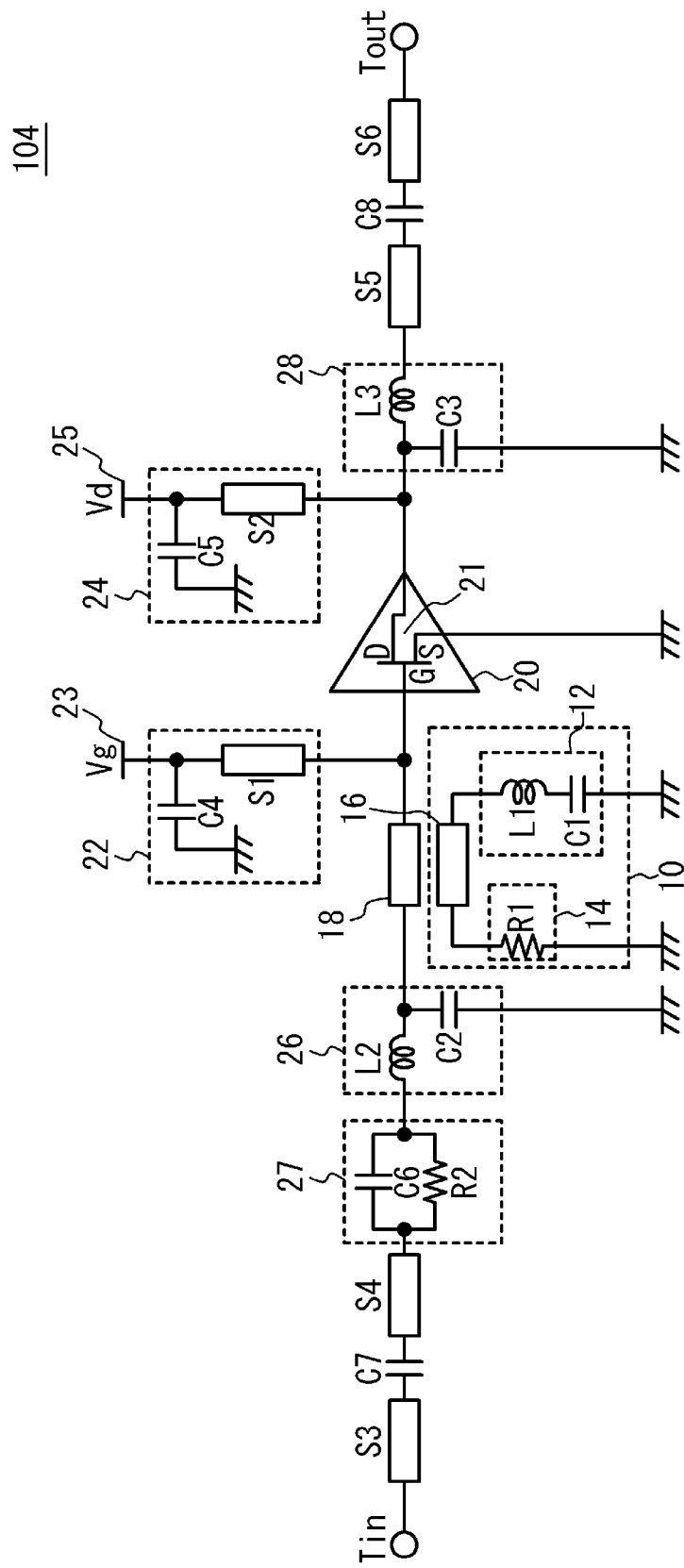
FIG. 7 is a circuit diagram illustrating a high frequency circuit according to a second embodiment.

A second embodiment is a specific example of the first embodiment. FIG. 7 is a circuit diagram illustrating a high frequency circuit according to the second embodiment. As illustrated in FIG. 7, in a high frequency circuit 104, a transmission line S3, a capacitor C7, a transmission line S4, and a CR filter 27 are connected between the input terminal Tin and the matching circuit 26. A bias circuit 22 is connected between the transmission line 18 and the amplifier 20. A bias circuit 24 is connected between the amplifier 20 and the matching circuit 28. A transmission line S5, a capacitor C8, and a transmission line S6 are connected between the matching circuit 28 and the output terminal Tout. The transmission lines S3 to S6 are lines that propagate the high frequency signal. The capacitors C7 and C8 are DC cut capacitors that pass the high frequency signal and cut a DC (Direct Current) component.

The CR filter 27 includes a capacitor C6 and a resistor R2 connected in parallel. The CR filter 27 is a high-pass filter, passes the high frequency signal in the band amplified by the amplifier 20, and suppresses a signal having a low frequency and a low stability coefficient K. The bias circuit 22 includes a transmission line S1 and a capacitor C4. The transmission line S1 is connected between the gate G of the transistor 21 and a bias terminal 23, and has a length of λ/4, for example. The capacitor C4 is connected between the bias terminal 23 and the ground. The bias circuit 22 supplies a gate bias voltage Vg supplied to the bias terminal 23 to the gate G, and suppresses the high frequency signal from passing through the bias terminal 23.

The bias circuit 24 includes a transmission line S2 and a capacitor C5. The transmission line S2 is connected between the drain D of the transistor 21 and a bias terminal 25, and has a length of λ/4, for example. The capacitor C5 is connected between the bias terminal 25 and the ground. The bias circuit 24 supplies a drain bias voltage Vd supplied to the bias terminal 25 to the drain D, and suppresses the high frequency signal from passing through the bias terminal 25.

The matching circuit 26 includes an inductor L2 connected in series and a capacitor C2 connected in shunt. The matching circuit 28 includes an inductor L3 connected in series and a capacitor C3 connected in shunt. The matching circuits 26 and 28 are LCL-T type circuits, CLC-π type circuits or the like, and can be appropriately formed by using inductors and capacitors. The matching circuits 26 and 28 may be formed by using distributed constant circuits. Other configurations are the same as those in FIG. 1 of the first embodiment, and the description thereof will be omitted.

(Simulation)

The simulation of the high frequency circuit 104 in the second embodiment was performed. The simulation was performed for a circuit A provided with the stabilizing circuit 10 and a circuit B without the stabilizing circuit 10. The simulation conditions are as follows.

Operating frequency band: 3.4 GHz to 3.8 GHz
Transistor 21: GaN HEMT
R1: 50 Ω
L1 (nH), C1 (pF): The values of the elements were selected so that the resonance frequency of the series resonance circuit composed of L1 and C1 was included in the frequency band where the stability coefficient K<1 was satisfied in the circuit B without the stabilizing circuit 10.

Figure 8:
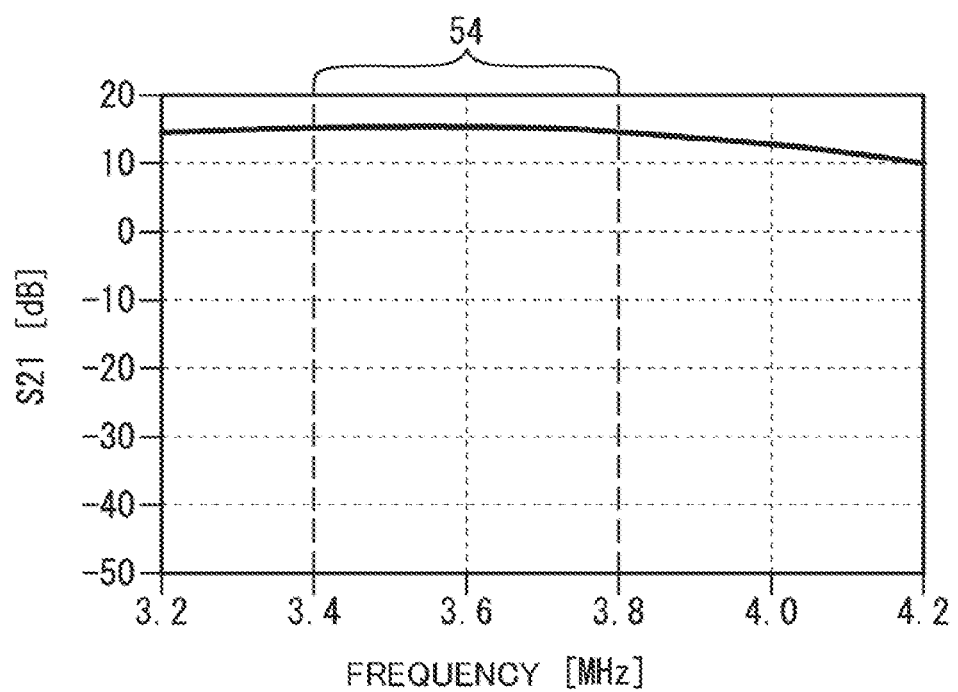
FIG. 8 is a diagram illustrating a parameter S21 with respect to a frequency in a circuit A.

FIG. 8 is a diagram illustrating the parameter S21 with respect to a frequency in the circuit A. As illustrated in FIG. 8, a plurality of parameters S21 at frequencies of 3.4 GHz, 3.6 GHz and 3.8 GHz are 15.358 dB, 15.636 dB and 14.971 dB, respectively. Thus, in the operating band 54 of 3.4 GHz to 3.8 GHz, the parameter S21 is about 15 dB.

Figure 9:
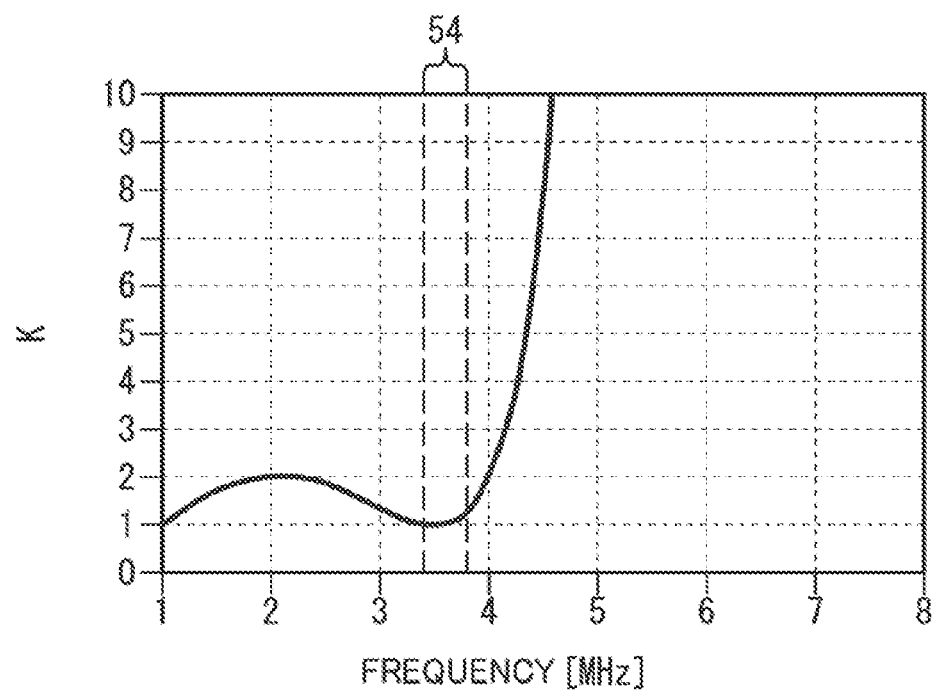
FIG. 9 is a diagram illustrating a stability coefficient K with respect to the frequency in the circuit A.

FIG. 9 is a diagram illustrating the stability coefficient K with respect to the frequency in the circuit A. As illustrated in FIG. 9, the stability coefficient K becomes small in the vicinity of an operating band 54. This is because the parameter S21 is large in the vicinity of the operating band 54. Further, the stability coefficient K is small when the frequency is around 1 GHz. When the frequency is 1 GHz to 8 GHz, the stability coefficient K is 1 or more. Thereby, the high frequency circuit 104 operates stably at 1 GHz to 8 GHz.

Table 1 illustrates the stability coefficients K and the parameter S21 in circuits A and B. The stability coefficient K is the lowest K in 1 GHz to 8 GHZ, and "S21" is the lowest parameter S21 in the operating band of 3.4 GHz to 3.8 GHz.

TABLE 1

| CIRCUIT | MATCHING CIRCUIT | K | S21 [dB] |
|---|---|---|---|
| A | PRESENCE | 1.046 | 14.97 |
| B | ABSENCE | 0.789 | 14.66 |

As illustrated in Table 1, in the circuit B without the stabilizing circuit 10, the stability coefficient K is 0.789. The stability coefficient K is the smallest around 1 GHz. The parameter S21 of the circuit B is 14.66 dB. In the circuit A provided with the stabilizing circuit 10, the stability coefficient K is 1.046. The stability coefficient K is the smallest at 3.6 GHZ, and the stability coefficient K is 1 or more in the vicinity of 1 GHZ. As described above, in the circuit A, the stability coefficient K can be set to 1 or more while the parameter S21 representing the gain remains almost unchanged.

As in the circuit B, at the resonance frequency of the resonance circuit 12, the stability coefficient K of the high frequency circuit when the coupling line 16, the resonance circuit 12, and the resistance element 14 are not provided is less than 1. The coupling line 16, the resonance circuit 12, and the resistance element 14 are provided in such a high frequency circuit as in the circuit A, so that the stability coefficient K can be increased. If the stability coefficient K at the resonance frequency of the resonance circuit 12 when the coupling line 16, the resonance circuit 12 and the resistance element 14 are not provided in the high frequency circuit is 0.95 or less or 0.9 or less, it is preferable to provide the coupling line 16, the resonance circuit 12, and the resistance element 14.

As in the circuit B, the gain is likely to be large and the stability coefficient K is likely to be small at frequencies lower than the band of the high frequency circuit. Therefore, it is preferable that the resonance frequency of the resonance circuit 12 is lower than the operating frequency band of the high frequency circuit. The resonance frequency of the resonance circuit 12 is more preferably ½ or less of the operating frequency band of the high frequency circuit, and further preferably ⅓ or less of the operating frequency band of the high frequency circuit.

In the first and the second embodiments, an example of a FET such as a GaN HEMT has been described as the transistor 21, but the transistor 21 may be a bipolar transistor. In the high frequency circuit in which the transistor 21 is the FET, the input electrode is the gate, and the output electrode is the drain, the stability coefficient K is likely to be less than 1 at a frequency lower than the operating band unless the stabilizing circuit 10 is provided. Therefore, it is preferable to provide the stabilizing circuit 10 in order to set the stability coefficient K to 1 or more.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A high frequency circuit comprising:
   a transistor having an input electrode that inputs a high frequency signal and an output electrode that outputs the high frequency signal;
   a transmission line that is connected to any one of the input electrode and the output electrode, and transmits the high frequency signal;
   a coupling line electrically separated from the transmission line to an extent that an electromagnetic field coupling is enabled with the transmission line; and
   a resonance circuit that is connected between a first end of the coupling line and a reference potential, and minimizes an impedance between the first end and the reference potential at a resonance frequency, and
   wherein the resonance frequency of the resonance circuit is lower than an operating frequency band of the high frequency circuit.

2. The high frequency circuit as claimed in claim 1, further comprising:
   a resistance element;
   wherein a first end of the resistance element is connected to a second end of the coupling line, a second end of the resistance element is connected to the reference potential, and a resistance value of the resistance element is ½ times or more and twice or less a characteristic impedance of the coupling line at a center frequency of the operating frequency band of the high frequency circuit.

3. The high frequency circuit as claimed in claim 1, further comprising:
   an input terminal that inputs the high frequency signal; and
   a matching circuit that matches an input impedance of the input terminal with an input impedance of the input electrode;
   wherein a first end of the transmission line is connected to the matching circuit, and a second end of the transmission line is connected to the input electrode.

4. The high frequency circuit as claimed in claim 1, further comprising:
   an output terminal that inputs the high frequency signal; and
   a matching circuit that matches an output impedance of the output electrode with an output impedance of the output terminal;
   wherein a first end of the transmission line is connected to the output electrode, and a second end of the transmission line is connected to the matching circuit.

5. The high frequency circuit as claimed in claim 1, wherein
   the input electrode is a gate and the output electrode is a drain.

6. The high frequency circuit as claimed in claim 1, wherein
   at the resonance frequency of the resonance circuit, a stability coefficient of the high frequency circuit when the coupling line and the resonance circuit are not provided is less than 1.

7. The high frequency circuit as claimed in claim 1, wherein
   the resonance frequency of the resonance circuit is ½ or less of the operating frequency band of the high frequency circuit or ⅓ or less of the operating frequency band of the high frequency circuit.

8. The high frequency circuit as claimed in claim 1, wherein
   the resonance circuit includes an inductor and a capacitor connected in series between the first end of the coupling line and the reference potential.

* * * * *